US008637821B2

(12) United States Patent
Buijsse et al.

(10) Patent No.: US 8,637,821 B2
(45) Date of Patent: Jan. 28, 2014

(54) BLOCKING MEMBER FOR USE IN THE DIFFRACTION PLANE OF A TEM

(75) Inventors: Bart Buijsse, Eindhoven (NL); Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 214 days.

(21) Appl. No.: 13/168,415

(22) Filed: Jun. 24, 2011

(65) Prior Publication Data

US 2011/0315876 A1 Dec. 29, 2011

(30) Foreign Application Priority Data

Jun. 24, 2010 (EP) .................................... 10167258

(51) Int. Cl.
*G01N 23/00* (2006.01)
*G21K 7/00* (2006.01)

(52) U.S. Cl.
USPC ......... 250/311; 250/306; 250/307; 250/396 R

(58) Field of Classification Search
USPC ............... 250/306, 307, 311, 396 R; 850/8, 9
See application file for complete search history.

(56) References Cited

U.S. PATENT DOCUMENTS

| 5,814,815 | A | 9/1998 | Matsumoto et al. | |
|---|---|---|---|---|
| 6,674,078 | B2 | 1/2004 | Nagayama et al. | |
| 7,915,584 | B2 * | 3/2011 | Tiemeijer et al. | 250/310 |
| 8,071,954 | B2 * | 12/2011 | Wagner et al. | 250/396 R |
| 2008/0296509 | A1 * | 12/2008 | Schroder et al. | 250/398 |
| 2009/0302217 | A1 | 12/2009 | Wagner et al. | |
| 2010/0038537 | A1 | 2/2010 | Benner | |

FOREIGN PATENT DOCUMENTS

| EP | 2131384 | * 12/2009 | ............. H01J 37/26 |
|---|---|---|---|
| WO | 03068399 | 8/2003 | |

OTHER PUBLICATIONS

R. Danev, H.Okawaran,,N.Usuda,K.Kametani, K.Nagayama, "A Novel Phase-contrast Transmission Electron Microscopy Producing High-contrast Topographic images of weak objects" J. of Biological Physics, vol. 28, 627-635, 2002.*
R. Danev, R.M. Glaeser, K. Nagayama, "Practical factors affecting the performance of thin-film phase plate for transmission electron microscopy", Ultramicroscopy, vol. 100, 312-325, 2009.*
Glaeser, R. M., et al., 'Section 3.8: The concept of a phase contrast transfer function is of central importance in the interpretation of high-resolution images,' and 'Section 3.9: Partial coherence imposes and envelope on the phase contrast transfer function ED,' Electron Crystallography of Biological Macromolecules, Jan. 1, 2007, pp. 67-72, Oxford University Press.

(Continued)

*Primary Examiner* — Jack Berman
*Assistant Examiner* — Meenakshi Sahu
(74) *Attorney, Agent, or Firm* — Scheinberg & Associates, PC; Michael O. Scheinberg

(57) ABSTRACT

The invention relates to a blocking member to be placed in the diffraction plane of a TEM. It resembles the knife edge used for single sideband imaging, but blocks only electrons deflected over a small angle. As a result the Contrast Transfer Function of the TEM according to this invention will equal that of a single sideband microscope at low frequencies and that of a normal microscope for high frequencies. Preferable the highest frequency blocked by the blocking member is such that a microscope without the blocking member would show a CTF of 0.5.

21 Claims, 11 Drawing Sheets

(56) References Cited

OTHER PUBLICATIONS

Lannes, A., 'Iterative Algorithms for Single-Side-Band Holography in Bright- and Dark-Field Microscopy,' J. Phys. D: Appl. Phys., Dec. 21, 1976, pp. 2533-2544, vol. 9, No. 18.

Nagayama, Kuniaki, 'Development of Phase Plates for Electron Microscopes and their Biological Application,' European Biophysics Journal, Feb. 8, 2008, pp. 345-358, vol. 37, No. 4.

Downing, Kenneth, H., 'Discrimination of Heavy and Light Components in Electron Microscopy Using Single-Sideband Holographic Techniques,' Optik, 1975, pp. 155-175, vol. 42, No. 2.

* cited by examiner

BLOCKING MEMBER FOR USE IN THE DIFFRACTION PLANE OF A TEM

TECHNICAL FIELD OF THE INVENTION

The invention relates to a transmission electron microscope for imaging a sample, and in particular, to a transmission electron microscope including a blocking member for blocking part of the image in the Fourier domain.

BACKGROUND OF THE INVENTION

Such a Transmission Electron Microscope (TEM) is known from "Discrimination of heavy and light components in electron microscopy using single-sideband holographic techniques", K. Downing et al., Optik 42 (1975), page 155-175, and is known as single-sideband imaging.

In a TEM, a sample is imaged by irradiating the sample with a beam of electrons. Often this beam of electrons is a parallel beam. Typically the sample is sufficiently thin for most of the electrons to pass through the sample. Some electrons are elastically scattered by the sample, and leave the sample under another direction than that they entered the sample. These scattered electrons are focused by the objective lens and form in the back-focal plane, of said objective lens, also known as the diffraction plane, a diffraction pattern.

It is noted that each position in the diffraction plane corresponds with a particular angle under which the electrons leave the sample. Therefore the pattern formed in the diffraction plane represents the (Fourier) transform of the image plane to the Fourier plane, For imaging a sample two contrast mechanisms exist: phase contrast and absorption contrast. Phase contrast occurs as a result of the interference of electrons that pass through the sample unhindered with elastically scattered electrons. Phase contrast typically occurs when the sample comprises little heavy atoms and many light atoms, such as carbon, hydrogen, etc. It is noted that in phase contrast the energy of the electrons is hardly changed and it is therefore also referred to as elastic deflection.

In the other contrast mechanism, absorption, electrons are scattered over a much larger angle, as a result of which they are intercepted by, for example, an aperture in the diffraction plane, Some of the electrons are even reflected, resulting in back-scattered electrons. Further some electrons loose energy by e.g. ionizing events, and or not focused in the diffraction plane anymore. All this results in that these electrons do not contribute to the imaging and are commonly referred to as non-elastic deflection.

It is noted that biological samples, polymers, etc., often show phase contrast and little absorption contrast.

The phase contrast of a TEM is often expressed by the Contrast Transfer Function (CTF), which expresses the contrast as a function of the spatial frequency. The CTF in turn can be described as the product of two sub-functions: the envelope function and the Phase Contrast Transfer Function, with both these functions also a function of the spatial frequency. A detailed description of these functions, and their interdependency, is found in "Electron Crystallography of Biological Macromolecules", R. M. Glaeser et al. (2007), Oxford University Press, ISBN 978-0-19-508871-7, hereby incorporated by reference. More specifically in page 67-72, paragraphs 3.8 and 3.9.

The Phase Contrast Transfer Function is among others a function of the defocus of the lens imaging the sample, and thus of the distance from the sample to the focal plane of the lens. To achieve contrast over a relative wide spatial frequency band users of a TEM often operate at the so-called Scherzer defocus. Glaeser describes the well-known Scherzer defocus (see also FIG. 3.4 of said publication) and the resulting phase contrast transfer function (see e.g. FIG. 3.5 of said publication). Multiplication of the phase contrast transfer function with the envelope function as described in pages 69-72, paragraph 3.9 results in the CTF.

It is noted that for high frequencies the phase contrast transfer function shows oscillations between +1 and −1, and therefore the CTF shows similar oscillations. At which frequency the first zero crossing occurs, depends among others on the distance of the sample to the focal plane of the imaging lens. The Scherzer defocus is often used as it shows a large frequency band where the CTF is continuously positive (above zero). For modern TEM's and biological samples the PCTF, the first zero crossing at Scherzer defocus is typically at a spatial frequency above 3 $nm^{-1}$, corresponding with a resolution in the image of 0.3 nm (3 Ångstrom). Such a resolution is typically considered sufficient for biological imaging.

As well-known to the person skilled in the art, and as shown in the before mentioned literature, the CTF is low for low spatial frequencies. This implies that in images of a sample showing phase contrast large structures are hard to detect.

In the known method of single-sideband imaging, as described by Downing, half the diffraction plane is blocked (removed) by placing a knife edge in the diffraction plane, covering 50% of the diffraction pattern. As a result of this half of the electrons, the electrons that are scattered such that they are intercepted by the knife edge, cannot interfere with the central beam of undiffracted electrons.

It is noted that single-sideband imaging is also described in "Electron Crystallography of Biological Macromolecules", R. M. Glaeser et al. (2007), Oxford University Press, ISBN 978-0-19-508871-7, more specifically page 74, paragraph 3.11: 'Single sideband images: blocking half of the diffraction pattern produces images whose transfer function has unit gain at all spatial frequencies.'

In SSB imaging half of the Fourier space is removed by placing a knife edge in the diffraction plane, covering 50% of the diffraction pattern. By discarding half of the electrons, the contrast is governed by the envelope function only. However, as half of the electrons are discarded, the realized contrast is 'only' 50% of the envelope function.

A disadvantage of the single side band method is that the achieved contrast is at best 50% of the envelope.

SUMMARY OF THE INVENTION

A blocking member in the diffraction plane of a TEM blocks in at least one direction spatial frequencies from a low frequency to a high frequency having the high spatial frequency lower than or equal to the lowest spatial frequency where an image of the diffraction plane imaged without the blocking member shows a Contrast Transfer Function of approximately 50%.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The invention is now elucidated on the hand of figures, where identical reference numerals refer to corresponding features.

DETAILED DESCRIPTION OF PREFERRED EMBODIMENTS

Figure 1:
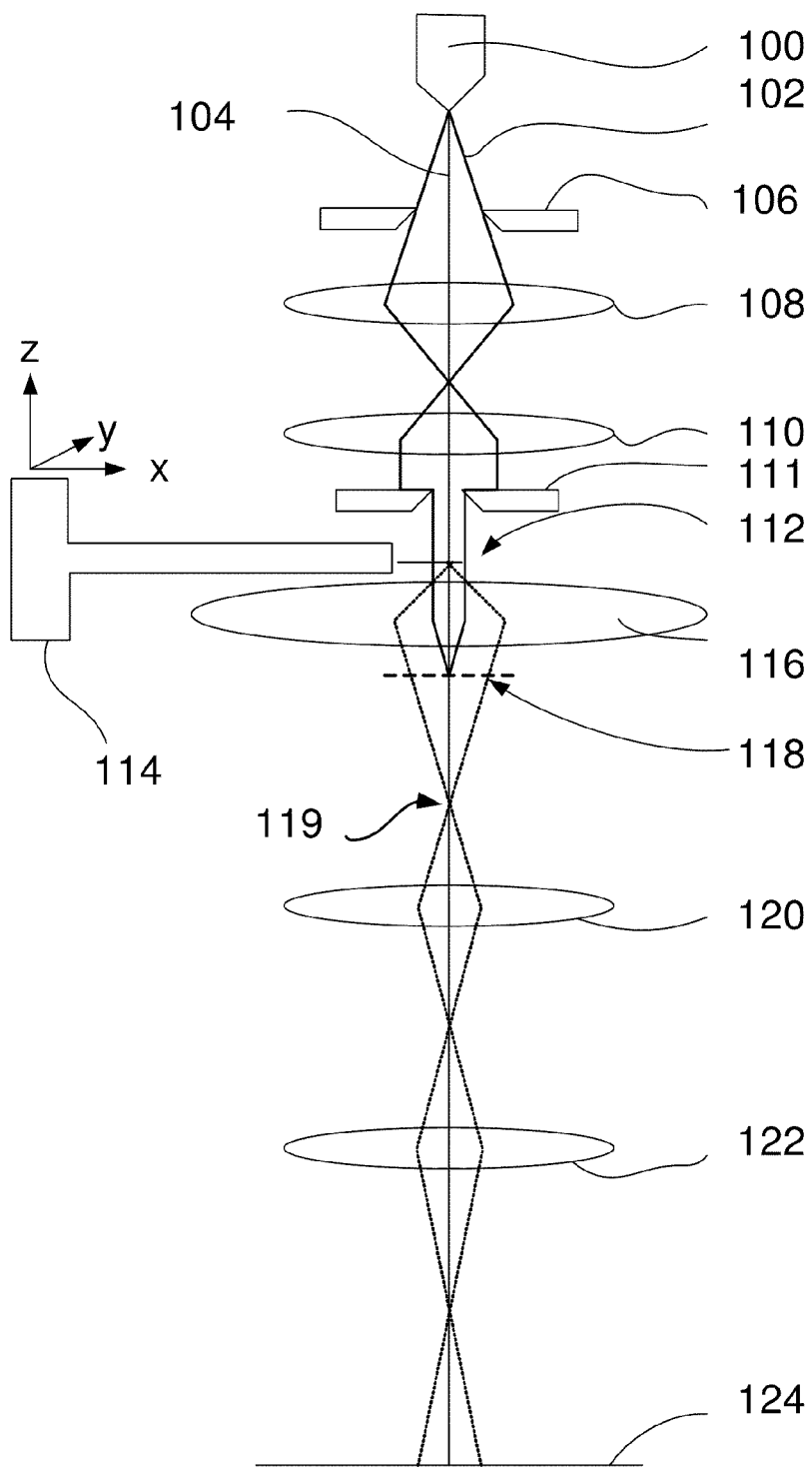
FIG. 1 schematically shows a TEM

The present invention presents a method in which the CTF in a large frequency band equals 50% of the envelope function, and for a large frequency band substantially more than 50% of the envelope function.

To that end the TEM according to the invention is characterized in that the high spatial frequency blocked by the blocking member is lower than or equal to the lowest spatial frequency where an image of said diffraction plane imaged without the blocking member shows a Contrast Transfer Function of approximately 50%.

By having a blocking member in the diffraction plane that does not block half of the Fourier plane, but only a part, such as a half circle, the blocking member does not block electrons that are deflected/scattered over a larger angle (the electrons contributing to a high spatial frequency). This implies that for a spatial frequency above said high spatial frequency the CTF shows it normal behavior, at first rising to a value larger than 0.5 (thus showing more contrast than available in SSB imaging) and then starting its oscillations. The invention thus combines good contrast at low spatial frequencies with the higher contrast available for other spatial frequencies in e.g. the Scherzer defocus.

It is noted that an improvement of the CTF at low frequencies can also be achieved using so-called phase plates, as e.g. described in U.S. Pat. No. 5,814,815 to Hitachi and U.S. Pat. No. 6,674,078 to JEOL. Here a phase plate is used to realize a phase shift between the undiffracted electrons with respect to the diffracted electrons, analogous to the working of a Zernike phase plate in light optics. Although this results in said improvement of the CTF at low frequencies, it also lowers the frequency where the first zero in the CTF occurs. Further it involves applying a voltage to a small structure (in the case of U.S. Pat. No. 5,814,815 to Hitachi), or dealing with fragile and contaminating thin carbon film (in the case of U.S. Pat. No. 6,674,078 to JEOL), while in the present solution no additional electrical voltages need to be applied, nor is there a need for a fragile carbon foil.

It is further noted that the blocking member needs to stop (absorb) the electrons impinging thereon, or scatter the electrons under a large angle. Therefore the blocking member typically comprises a heavy metal for stopping/scattering/absorbing the electrons.

In an embodiment the blocking member is connected to one or more support arms.

The one or more support arm supports the blocking member and connect it to a more macroscopic structure, so that it can be positioned with, for example, a positioning system as used for apertures in a TEM.

The one or more support arms should be rigid enough, but on the other hand it should intercept as little electrons as possible. The support used also intercepts electrons, thereby resulting in a lower contrast in that direction and frequency. Therefore the support arms should cover as little space in the diffraction plane as possible.

In another embodiment the blocking member is supported by a thin film, said film transparent to the impinging electrons.

Such supporting films, such as carbon films, graphene films, or thin silicon film are known to the person skilled in the art. It is noted that the film is preferable electrically conductive, as otherwise charging occurs.

In an embodiment the blocking member resembles a rectangle.

By forming the blocking member in the form of a rectangle, a blocking member with a straight edge is formed. By positioning the beam of undiffracted (undeflected) electrons just beside the straight edge such that this beam does not impinge thereon, part of the Fourier space is blocked, resulting in the partial SSB imaging.

It is noted that, as the blocking structure is a rectangle, the blocked space is not in all directions identical. That is only the case in a structure where the outer diameter is formed at a constant distance from the undiffracted beam.

In another embodiment the blocking member resembles a trapezoid with varying width, wherein the diffraction pattern shows a spot of undiffracted electrons, and the blocked spatial frequency interval is chosen by positioning the beam of undiffracted electrons near a part of the blocking member with an appropriate width.

Due to the tapering width of the trapezoid the width near the beam of undiffracted electrons can be selected.

It is noted that the size of the diffraction pattern depends on the energy of the electrons impinging on the sample: a higher energy results in a smaller size of the diffraction pattern. Also the defocus used influences the spatial frequency where the CTF reaches a value of 0.5. This implies that the size of the area of the diffraction plane to be blanked should preferably be tunable as well.

In another embodiment the blocking member shows a beam with a discrete number of steps, each with a different width. Here the width appropriate for e.g. the electron energy used can be selected in discrete values.

In another embodiment the blocking member resembles a half-circle.

Assuming that the undiffracted beam is focused at the centre of the circle, this embodiment has a high frequency that is equal in all directions.

In a further embodiment the half-circle shows a straight edge, and the support arm extends perpendicular or parallel to said straight edge.

Although there is no preference for any direction from an optical point of view, these directions are preferred when lithographic techniques are used to produce such structures.

In another embodiment the blocking member is placed in a plane that is an image of the diffraction plane and where an anamorphotic image of the diffraction plane is formed.

The plane where an anamorphotic image is formed, for example using quadrupoles, results in a plane where the diffraction pattern is imaged as a number of stripes, instead of points. This results in lower peak current densities. This may be preferable when avoiding contamination, damage, or other current density related issues.

In yet another embodiment the blocking member is placed in a plane that is an image of the diffraction plane and the imaging of the diffraction plane onto the said plane is at least in part realized by transfer optics that are part of corrector optics, the corrector optics for correcting the aberrations of the lens forming the diffraction pattern.

As known to the person skilled in the art correctors are typically equipped with transfer optics. By combining transfer optics that image the diffraction plane with the transfer optics used for a corrector, a compact design is realized.

In yet another embodiment at least part of the blocking member is electrically isolated from earth and electrically connected to a current measurement unit for measuring the current impinging on at least a part of the blocking member.

In yet another embodiment the current measurement is used to position the beam of undiffracted electrons with respect to the blocking member.

In yet another embodiment the transmission electron microscope further comprises means for heating the blocking member.

Heating the blocking member is used to avoid contamination and/or clean the blocking member when contamination occurred. Hereby e.g. charging of the blocking member is kept to a minimum.

In yet another embodiment the diffraction pattern shows a spot of undiffracted electrons and the blocking member shows an indent at the location where the beam of undiffracted electrons is closest to the blocking member, as a result of which contamination of the blocking member is reduced.

FIG. 1 schematically shows a TEM.

The TEM comprises an electron source 100 producing a beam of electrons 102 around optical axis 104. The amount of electrons accepted from the source is governed by aperture 106. Condenser lenses 108 and 110 then form a parallel beam of electrons, from which aperture 111 accepts a part. Herewith a parallel beam of electrons is formed. This beam irradiates the sample 112, that is positioned on positioning unit 114. The positioning unit enables the sample to be moved in the x, y, and z direction, as well as rotate around the x-axis. Objective lens 116 then forms an enlarged image of the object at first image plane 119, which enlarged image is further enlarged by lenses 120 and 122 and projected on sensor 124. Sensor 124 may be a camera, but also fluorescent screens are used. The objective lens also forms a diffraction pattern in the diffraction plane 118.

It is noted that this description shows the TEM operating in TEM mode, where a parallel beam illuminates the sample and the sample is imaged. As known to the person skilled in the art a TEM is typically equipped to work in many other modes as well, including modes where the sample is illuminated with convergent of divergent beams, beams focused on and scanned over the sample, imaging of the diffraction plane on the sensor, etc.

Figure 2:
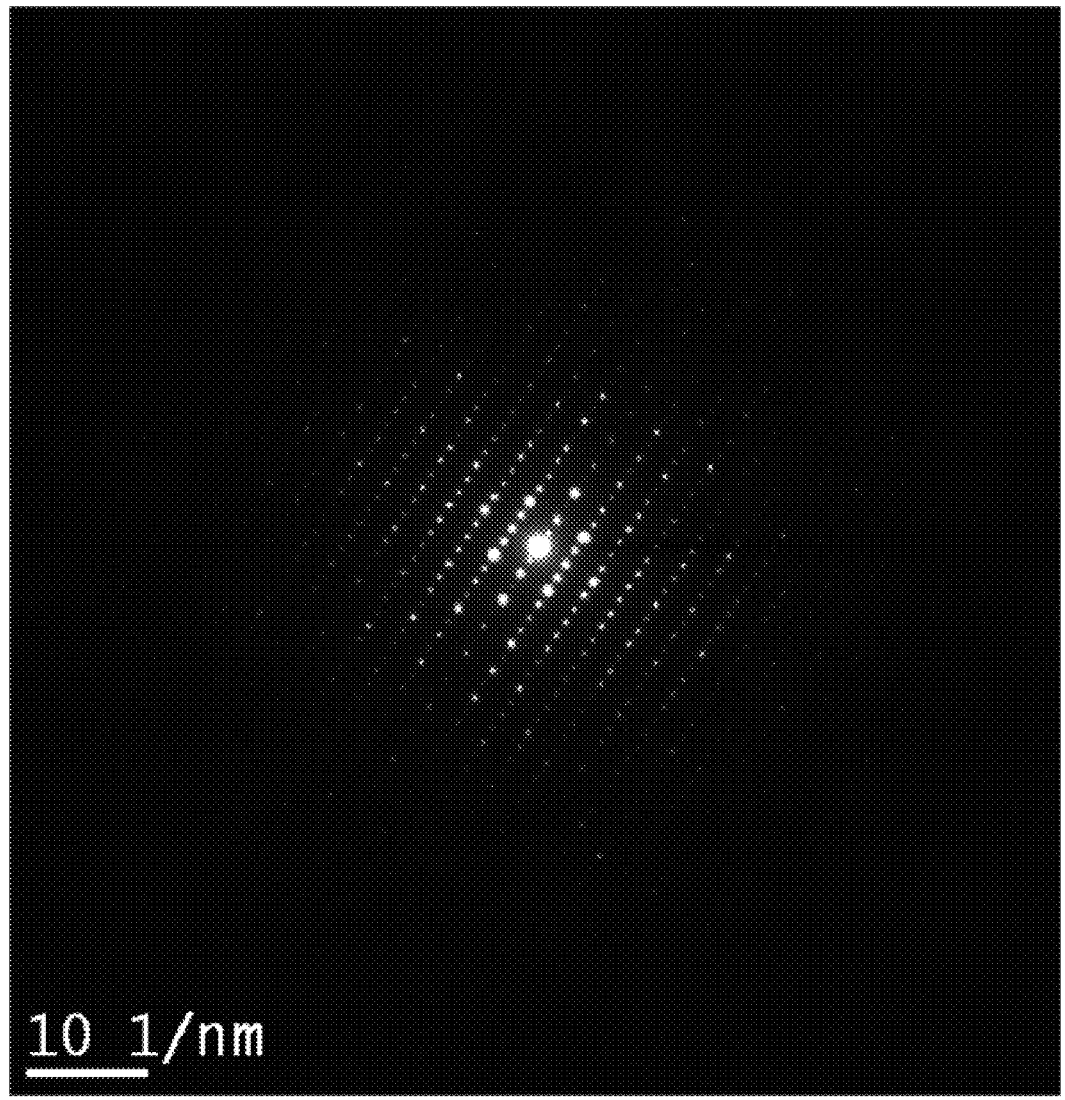
FIG. 2 shows a diffraction pattern

FIG. 2 shows a diffraction pattern.

The diffraction pattern shown here is of a crystalline material, as is evident of the spots shown. It shows a strong central spot, formed by the undiffracted electrons, surrounded by a large number of spots formed by diffracted electrons. Due to the crystalline nature of the sample used here, there is a strong preference for electrons to be scattered under specific directions. It is noted that an amorphous sample (as most biological samples are) would show a diffuse distribution of the electron surrounding the central peak.

Figure 3:
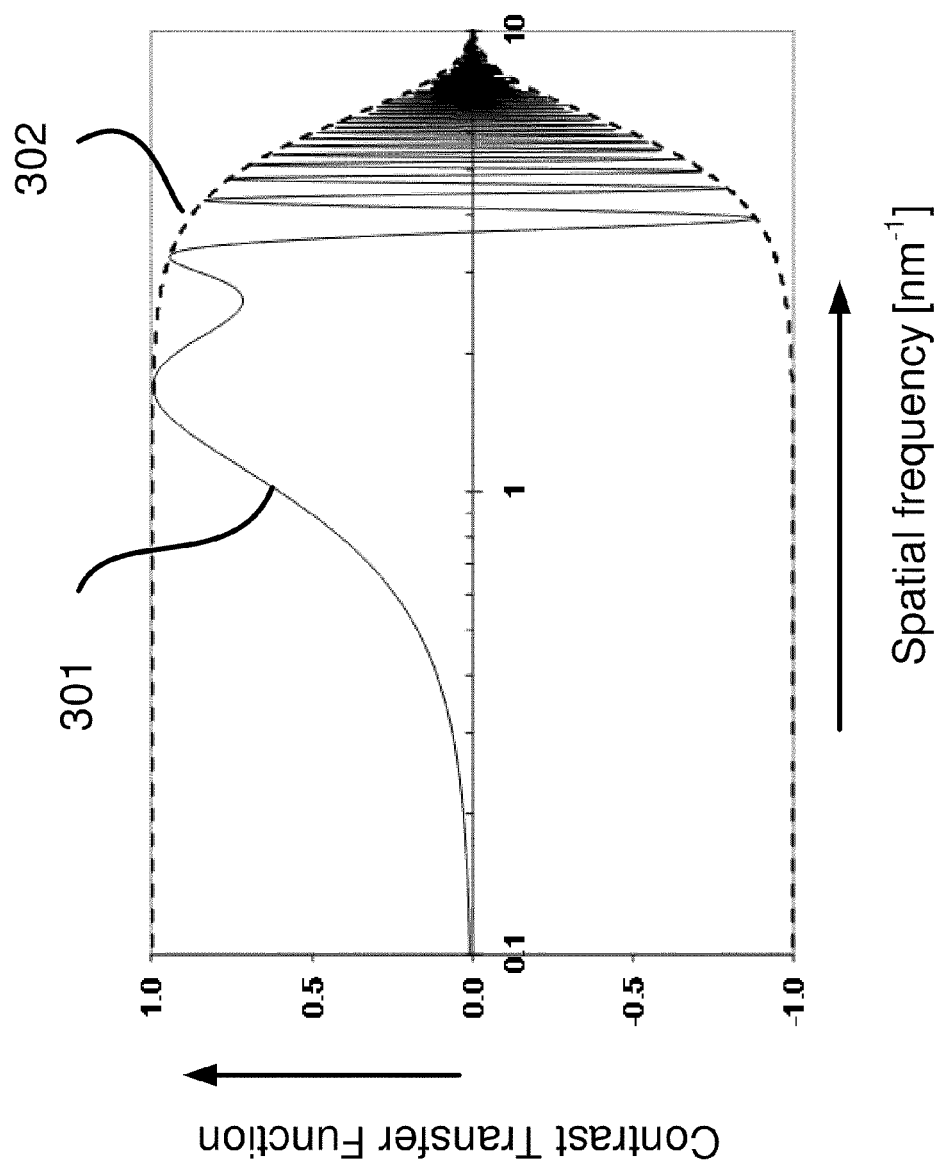
FIG. 3 shows schematically the Contrast Transfer Function of a TEM without blocking member

FIG. 3 schematically shows the Contrast Transfer Function of an objective lens.

FIG. 3 shows a graph of the CTF 301 in the so-named Scherzer focus. It shows that for low spatial frequencies of less than 1 $nm^{-1}$, the function is less 0.5, dropping to zero when going to a spatial frequency of zero. Therefore large structures, in this case larger than e.g. 1 nm, become less visible. For e.g. biologists this means that, although they can make images with high resolution, it is difficult to relate the high resolution observations with more macroscopic structures like organelles.

Furthermore the oscillations at high frequencies, here frequencies above 3.5 $nm^{-1}$, are clearly visible, as is the decrease of the amplitude of the maxima due to the envelope function 302. It is noted that the frequency where the function crosses the x-axis, and the amplitude of the envelope function as a function of frequency, are dependent on the quality of the lens. It is further noted that, although the CTF is here shown for the Scherzer defocus, similar CTF's can be derived for other (de)focus distances.

Figure 4:
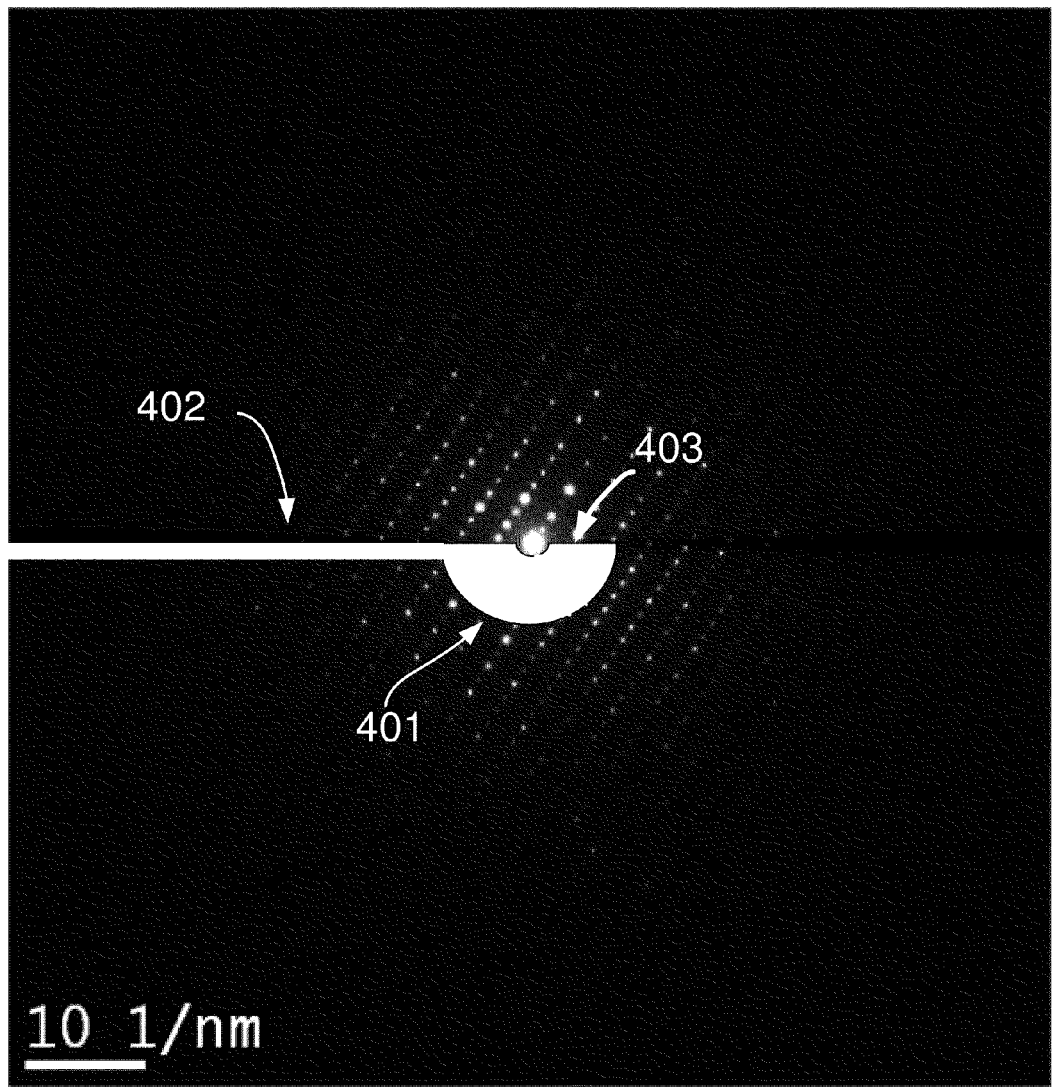
FIG. 4 shows the diffraction pattern of FIG. 2, with overlayed the blocking member
FIG. 5 schematically shows the Contrast Transfer Function of the TEM with blocking member
FIGS. 6A-6F schematically show different embodiments of the blocking member.

FIG. 4 schematically shows the diffraction pattern of FIG. 2 overlaid with the blocking member.

FIG. 4 shows the diffraction pattern shown in FIG. 2, on which a blocking member 401 is projected. The blocking member is connected to a more macroscopic structure (and eventually the TEM) by support arm 402.

It is noted that the blocking member is here formed as a half-circle with a straight edge 403. In the centre of the circle an indent is formed where the undiffracted beam can pass, so that these electrons do not impinge on the blocking member. This indent ensures a low frequency behavior of the blocking member for a low frequency that is identical in all directions.

Figure 5:
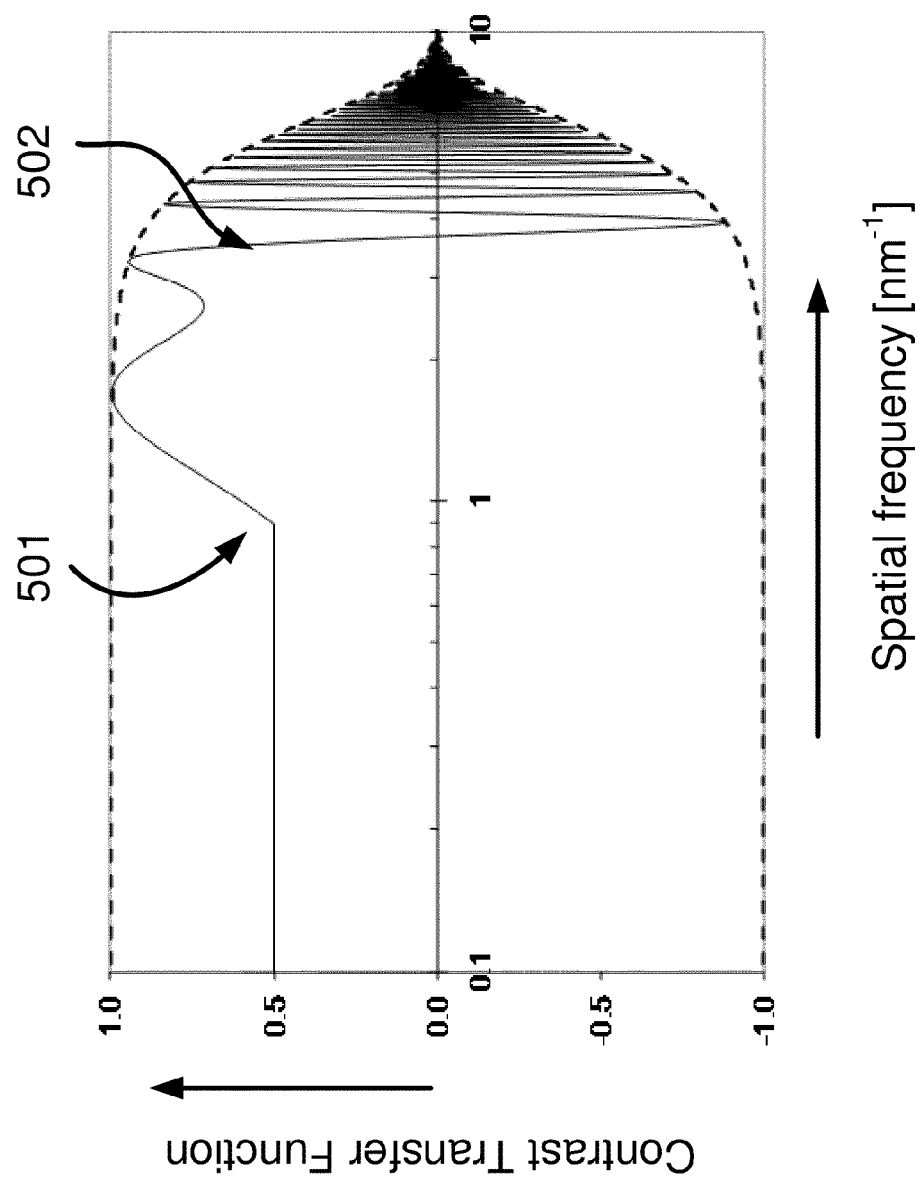

FIG. 5 schematically shows the Contrast Transfer Function of the TEM with blocking member.

Due to the blocking of electrons by blocking member 401, the CTF for all frequencies up to frequency 501 is effectively 50% of the envelope function, as 50% of the elastically scattered electrons in this area are discarded. Electrons that are scattered over an angle large enough to avoid the blocking member can form an image in the same fashion as would be the case in a TEM without the blocking member. Therefore the CTF rises, until due to its normal behavior it drops to a value below 50% for frequencies higher than frequency 502.

The result is an image where large object (low frequencies) are shown with a much higher contrast than normal, and high resolution is achieved with the same contrast as would be achieved normally. For the region of interest of, for example, biology, (resolution of 0.3 nm) this is a win-win situation.

FIGS. 6a to 6h give different implementations of the blocking member.

Figure 6A:
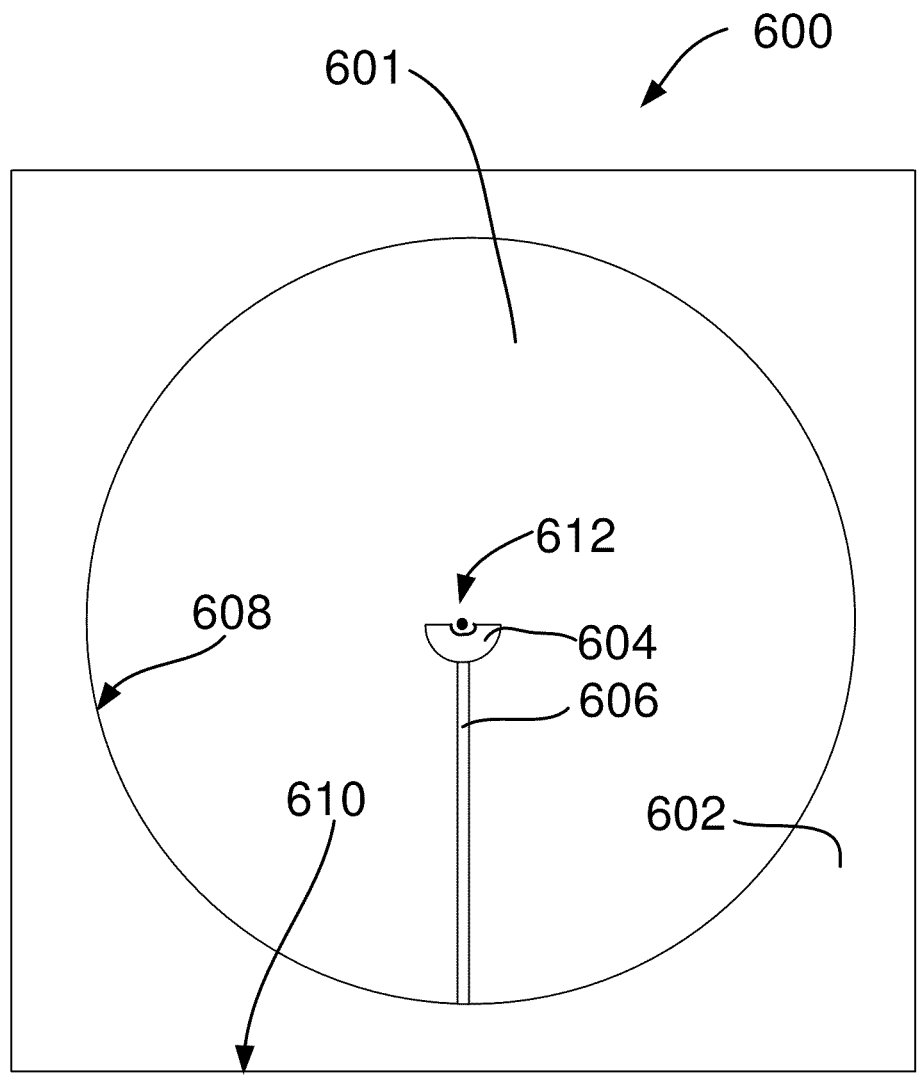

FIG. 6a shows a square chip 600 of e.g. silicon with an outer edge 610. Preferably the outer edge is dimensioned such, that it can be contained in e.g. an aperture mechanism of the TEM, so that it can be positioned mechanically. In the chip a round hole 601 is etched with a diameter 608. The diameter of the hole is chosen such that electrons that are non-elastically deflected (and thus are scattered over a large angle or lost energy) are intercepted by the silicon. Connected to the silicon 602 between the outer edge 610 and the outer diameter of the hole 601 is a support arm 606. At the distal end near the middle of the hole the support arm connect to the blocking member 604, that in this case is formed as a half circle. The half circle shows a straight edge, and the central beam of the diffraction pattern 612 is positioned close to this edge, but sufficiently removed that the blocking member does not intercept (much) of the electrons in the central beam.

It is noted that a small indent may be used to make it easier to pass the central beam.

Inventors calculated that the radius of the half-circle is, for a high voltage of 300 kV, between for example 10-15 μm, although with other microscopes and other accelation voltages different values can be found. The support arm is preferable as thin as possible, and experiments resulted in a structure where the support arm had a width of 3 μm.

It is noted that the structure can be gilded, or otherwise plated with a highly conductive material to avoid charging. The substrate can be conductive, or insulating, according to the surface coating given. Both substrate material and coating can be changed to accommodate demands with respect to vacuum integrity, thermal behavior, machinability, etc.

Figure 6B:
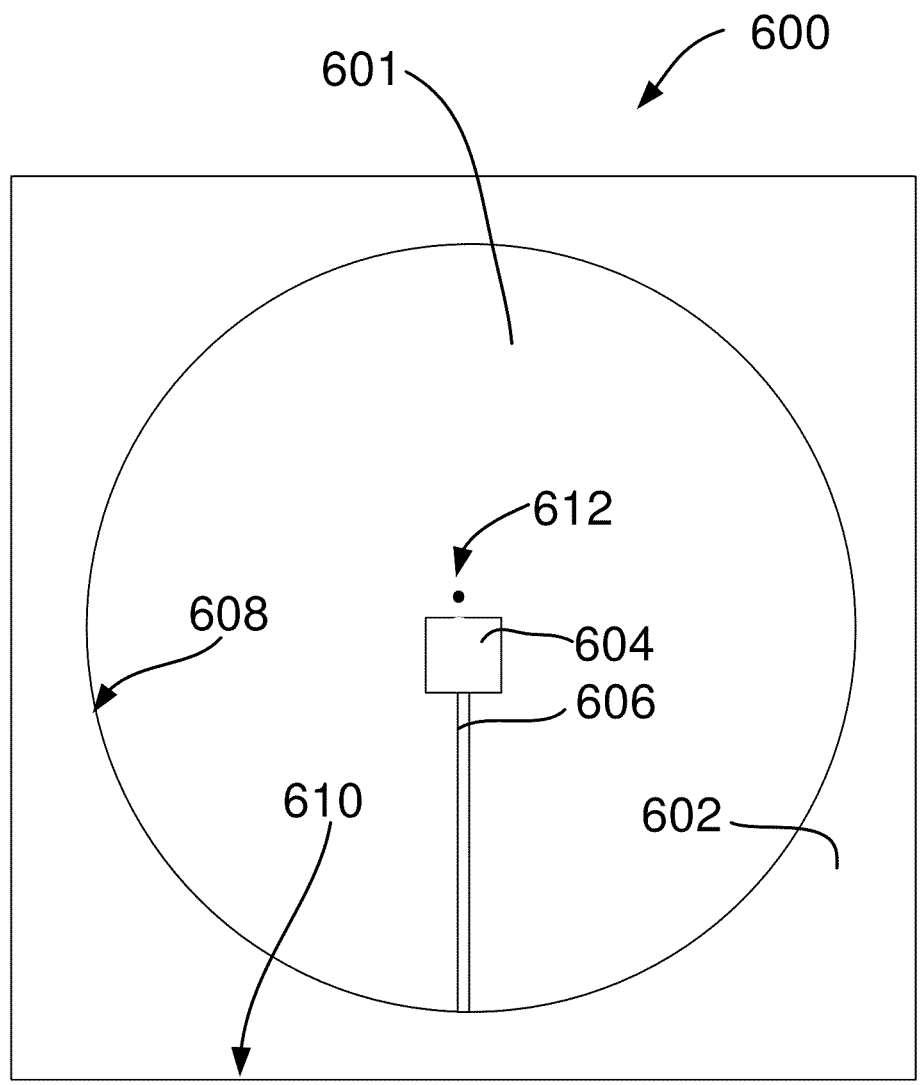

FIG. 6B shows a similar chip with a rectangular blocking member. The blocking member not being semi-circular around the central beam implies that its working is not identical in all directions, and that the frequency where the SSB imaging blends into the 'normal' CFT behavior differs in those directions. This may lead to artifacts in that the lowest resolution (with a given contrast) visible in one direction differs from the lowest resolution visible in another direction.

Figure 6C:
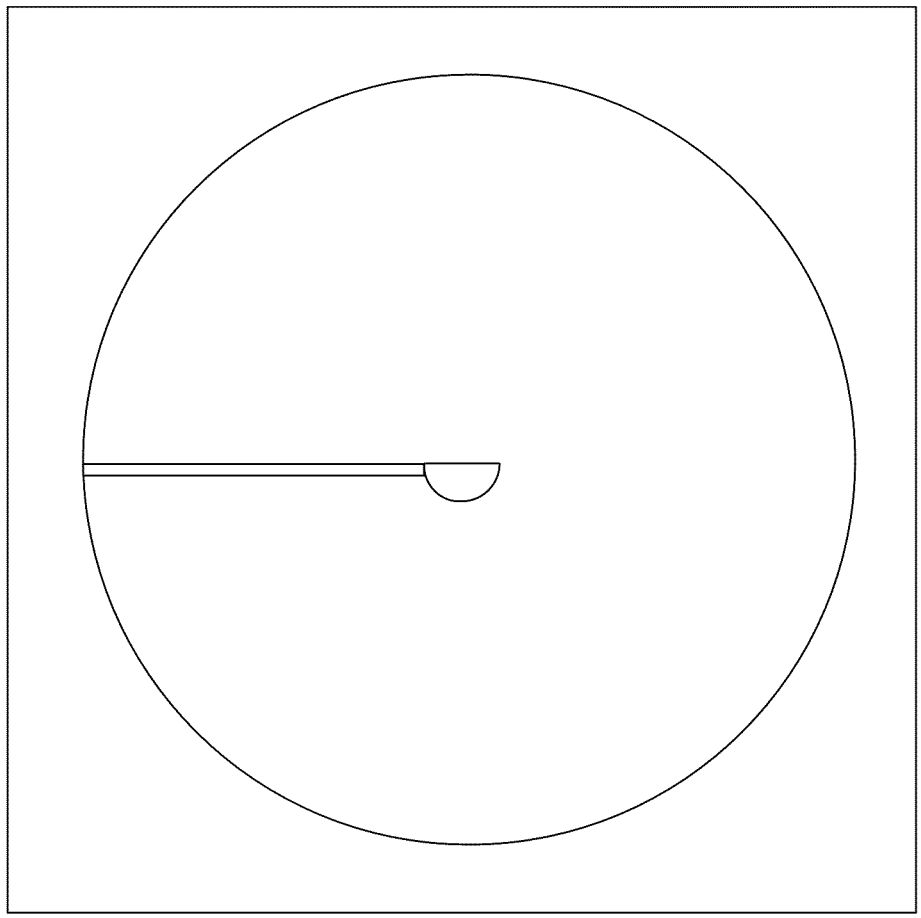

FIG. 6C shows the blocking member of FIG. 6A, but now the support art is parallel to the straight edge of the half-circle.

Figure 6D:
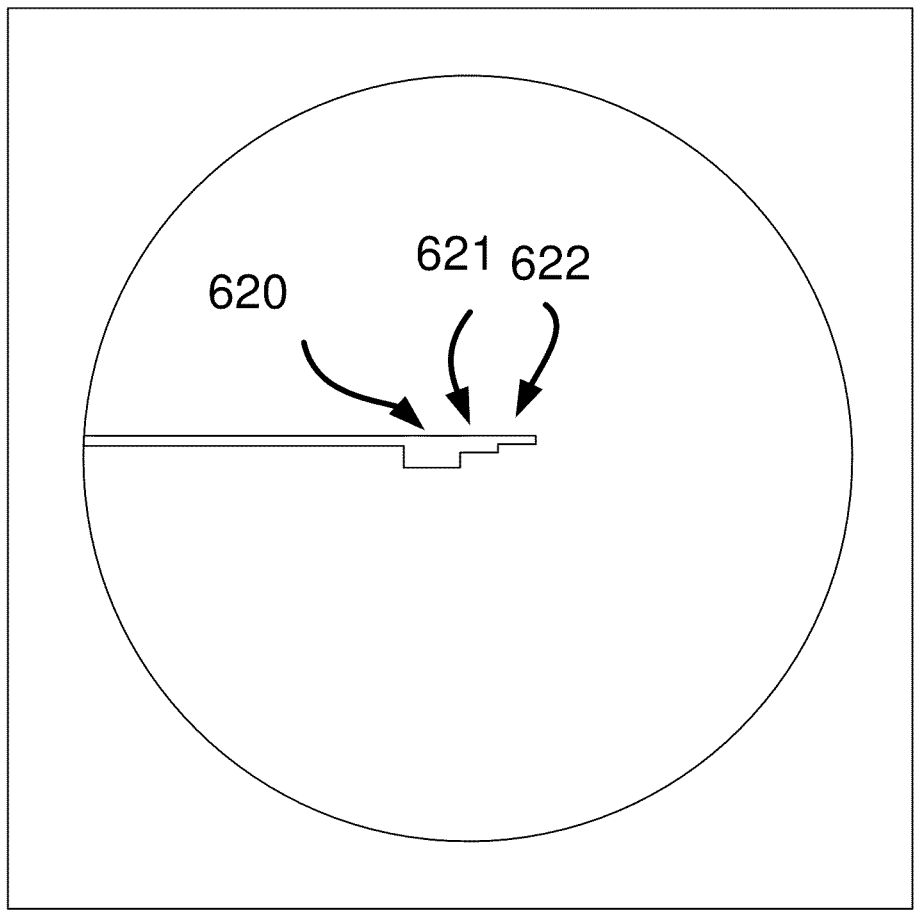

FIG. 6D shows a blocking member with varying width. By placing the central spot neat positions 620, 621 or 622, respectively, a different width of the blocking member near the spot can be realized.

Figure 6E:
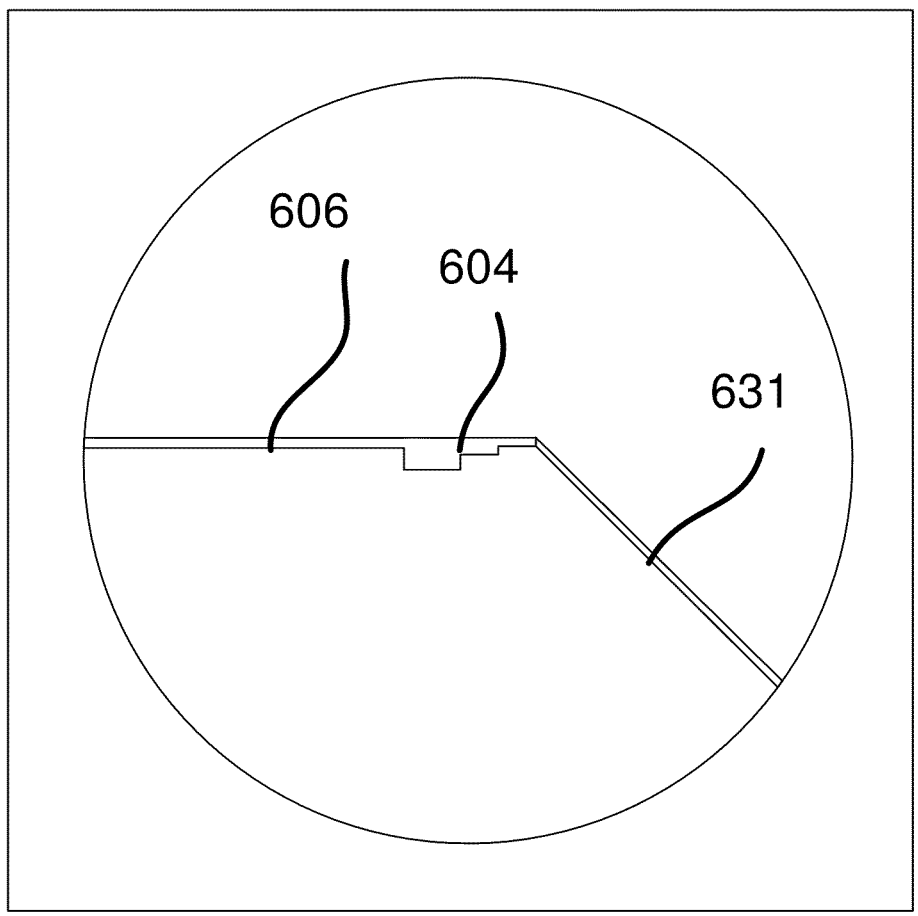

FIG. 6E shows a blocking member 604 that is not only supported by support arm 606, as is the case in FIG. 6D, but also by a second support arm 630. Hereby the structure becomes much stiffer, resulting in, for example, a structure that is less prone to vibration.

Figure 6F:
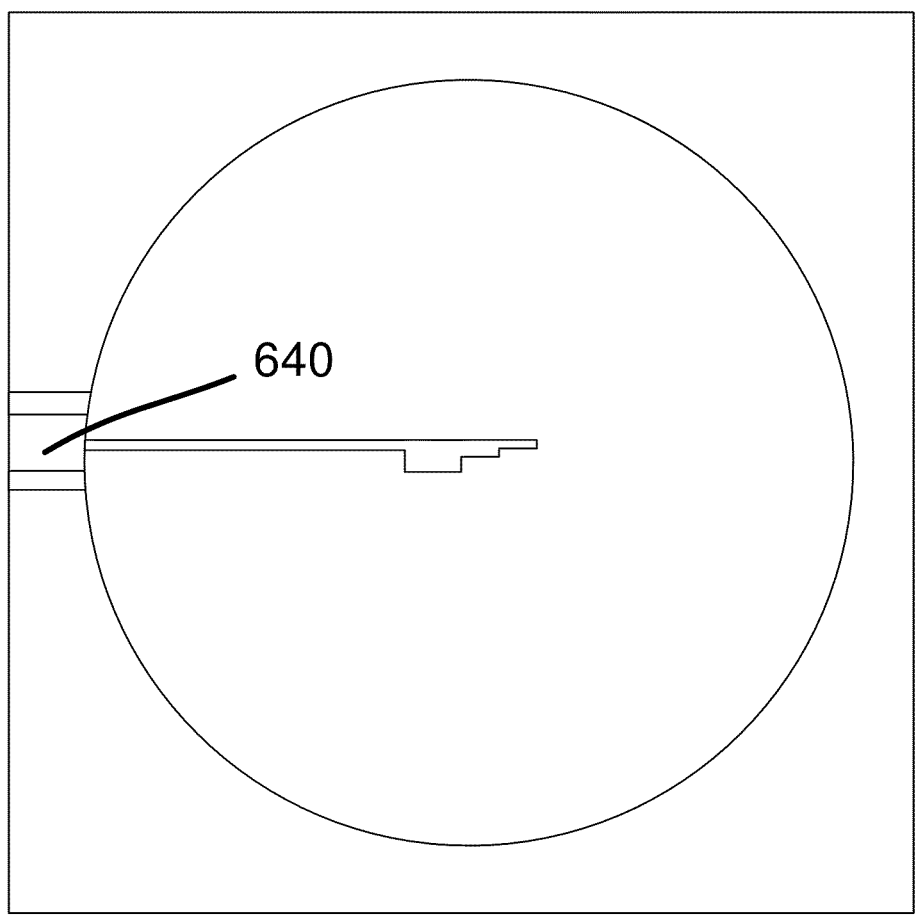

FIG. 6F shows a structure where an insulator is used for the substrate, and the blocking member is electrically insulated of most of the chip. An electrical connection can be made at pad 640, whereby a current measurement can be made to determine how much current impinges on the blocking member. Variant with two or more electrical connection to the blocking member are envisaged, that may or may not use the other side of the structure as well.

By measuring the current it can be determined how close the central beam is to the edge of the blocking member.

It is noted that it is also possible to place the blocking member on a thin, conductive foil that in itself is transparent to electrons.

Materials and structures described in one embodiment or described as part of the prior art may be used in other embodiments. Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What we claim:

1. A transmission electron microscope for imaging a sample, the transmission electron microscope showing a diffraction plane in which a diffraction pattern of the sample is formed, the diffraction plane representing an image of the sample in the Fourier domain, the transmission electron microscope comprising a blocking member positioned in the diffraction plane or an image thereof, the blocking member blocking a part of the Fourier domain, the blocked part of the Fourier domain in at least one direction extending from a low spatial frequency to a high spatial frequency, the highest spatial frequency blocked by the blocking member is lower than or equal to the lowest spatial frequency where an image of said diffraction plane imaged without the blocking member shows a Contrast Transfer of approximately 0.5, the microscope lacking a phase plate.

2. The transmission electron microscope of claim 1, wherein the blocking member is connected to a supporting arm.

3. The transmission electron microscope of claim 1, wherein the blocking member is supported by a thin film, said film transparent to the impinging electrons.

4. The transmission electron microscope of claim 1 in which the blocking member resembles a rectangle.

5. The transmission electron microscope of claim 1, wherein the blocking member resembles a trapezoid with varying width, wherein the diffraction pattern shows a spot of undiffracted electrons, and the blocked spatial frequency interval is chosen by positioning the beam of undiffracted electrons near a part of the blocking member with an appropriate width.

6. The transmission electron microscope of claim 1, wherein the blocking member shows a discrete number of steps, each with a different width.

7. The transmission electron microscope of claim 1, wherein the blocking member resembles a half-circle.

8. The transmission electron microscope of claim 7 in which the half-circle shows a straight edge connected to a support arm, and the support arm extends in a direction either perpendicular or parallel to said straight edge.

9. The transmission electron microscope of claim 1 in which the blocking member is placed in a plane that is an image of the diffraction plane and where an anamorphotic image of the diffraction plane is formed.

10. The transmission electron microscope of claim 1 in which the blocking member is placed in a plane that is an image of the diffraction plane and the imaging of the diffraction plane onto said plane is at least in part realized by transfer optics that are part of corrector optics, the corrector optics for correcting the aberrations of the lens forming the diffraction pattern.

11. The transmission electron microscope of claim 1 in which at least part of the blocking member is electrically isolated from earth and electrically connected to a current measurement unit for measuring the current impinging on at least a part of the blocking member.

12. The transmission electron microscope of claim 11 where the current measurement is used to position beam of undiffracted electrons with respect to the blocking member.

13. The transmission electron microscope of claim 1 further comprises means for heating the blocking member.

14. The transmission electron microscope of claim 1 wherein the diffraction pattern shows a spot of undiffracted electrons and the blocking member shows an indent at the location where the beam of undiffracted electrons is closest to the blocking member, as a result of which contamination of the blocking member is reduced.

15. Method of using of a blocking member in a transmission electron microscope, the method comprising:

providing a blocking member in the diffraction plane of the transmission electron microscope, the blocking member blocking a part of the diffraction plane, the blocked part blocks in at least one direction spatial frequencies from a low frequency to a high frequency, the high spatial frequency lower than or equal to the lowest spatial frequency where an image of said diffraction plane imaged without the blocking member shows a Contrast Transfer Function of approximately 50%, and passing electrons not blocked by the blocking member without those electrons passing through a phase plate.

16. A transmission electron microscope for imaging a sample, comprising;

an electron source producing a beam of electrons;

condenser lenses forming a parallel beam of electrons, the parallel beam irradiating the sample;

a positioning unit for holding the sample and manipulating the position of the sample;

an objective lens for forming an image, said objective lens defining a diffraction plane;

a blocking member positioned at or near the diffraction plane such that the highest spatial frequency blocked by the blocking member is lower than or equal to the lowest spatial frequency where an image of said diffraction plane imaged without the blocking member shows a Contrast Transfer of approximately 0.5, the microscope lacking a phase plate;

and a sensor for receiving an image projected by the objective lens.

17. The transmission electron microscope of claim 16 in which the blocking member resembles a rectangular, trapezoidal, or half-circular shape.

18. The transmission electron microscope of claim 16 in which the blocking member is supported by a thin film, said film transparent to the impinging electrons.

19. The transmission electron microscope of claim 16 in which the blocking member is placed in a plane that is an image of the diffraction plane and where an anamorphotic image of the diffraction plane is formed.

20. The transmission electron microscope of claim 16 in which the blocking member is electrically isolated from earth and electrically connected to a current measurement unit for measuring the current impinging on at least a part of the blocking member.

21. A transmission electron microscope for imaging a sample, the transmission electron microscope showing a diffraction plane in which a diffraction pattern of the sample is formed, the diffraction plane representing an image of the sample in the Fourier domain, the transmission electron microscope comprising a blocking member positioned in the diffraction plane or an image thereof, the blocking member blocking a part of the Fourier domain, the blocked part of the Fourier domain in at least one direction extending from a low spatial frequency to a high spatial frequency, the CTF in a large frequency band equals 50% of the envelope function and for a large frequency band substantially more than 50% of the envelope function, the microscope lacking a phase plate.

* * * * *